United States Patent
Lewis et al.

(10) Patent No.: US 8,205,352 B2
(45) Date of Patent: Jun. 26, 2012

(54) VAPOR DRYER HAVING HYDROPHILIC END EFFECTOR

(75) Inventors: John S. Lewis, Sunnyvale, CA (US); Michael Biese, San Jose, CA (US); Garrett H. Sin, San Jose, CA (US); Chidambara A. Ramalingam, Santa Clara, CA (US); Balaji Chandrasekaran, Santa Clara, CA (US); Tak Fan (Kerry) Ling, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/182,301

(22) Filed: Jul. 13, 2011

(65) Prior Publication Data
US 2011/0266736 A1 Nov. 3, 2011

Related U.S. Application Data

(63) Continuation of application No. 12/255,247, filed on Oct. 21, 2008, now Pat. No. 7,980,000, which is a continuation-in-part of application No. 11/967,533, filed on Dec. 31, 2007.

(60) Provisional application No. 60/882,894, filed on Dec. 29, 2006.

(51) Int. Cl.
*F26B 21/06* (2006.01)

(52) U.S. Cl. ....... 34/77; 34/78; 34/90; 134/30; 134/201; 414/217; 414/939; 118/500; 118/576

(58) Field of Classification Search ................ 34/60, 77, 34/78, 80, 90, 210, 242, 218; 134/30, 201; 414/217, 939; 118/500, 576
See application file for complete search history.

(56) References Cited

U.S. PATENT DOCUMENTS

| | | | |
|---|---|---|---|
| 3,890,305 A | 6/1975 | Weber et al. | |
| 5,156,810 A | 10/1992 | Ribi | |
| 5,331,987 A | 7/1994 | Hayashi et al. | |
| 5,445,699 A | 8/1995 | Kamikawa et al. | |
| 5,520,744 A | 5/1996 | Fujikawa et al. | |
| 5,775,000 A * | 7/1998 | Maekawa et al. | 34/58 |
| 5,798,113 A | 8/1998 | Dionne et al. | |
| 5,800,828 A | 9/1998 | Dionne et al. | |
| 5,800,829 A | 9/1998 | Dionne et al. | |
| 5,829,156 A * | 11/1998 | Shibasaki et al. | 34/58 |
| 5,834,001 A | 11/1998 | Dionne et al. | |
| 5,849,103 A | 12/1998 | Bennett et al. | |
| 5,869,077 A | 2/1999 | Dionne et al. | |
| 5,871,767 A | 2/1999 | Dionne et al. | |
| 5,874,099 A | 2/1999 | Dionne et al. | |
| 5,882,168 A * | 3/1999 | Thompson et al. | 414/416.01 |

(Continued)

FOREIGN PATENT DOCUMENTS

DE 3139168 A1 5/1982

(Continued)

*Primary Examiner* — Stephen M. Gravini
(74) *Attorney, Agent, or Firm* — Patterson & Sheridan, LLP

(57) ABSTRACT

Embodiments of the present invention generally relate to an apparatus and methods for rinsing and drying substrates. One embodiment provides an end effector comprising a body having a contact tip for contacting an edge area of a substrate, wherein the end effector is configured to support the substrate while the substrate is in a rinsing bath and while the substrate is being dried from the rinsing bath, and the contact tip comprises a hydrophilic material.

20 Claims, 5 Drawing Sheets

U.S. PATENT DOCUMENTS

| | | |
|---|---|---|
| 5,884,640 A | 3/1999 | Fishkin et al. |
| 5,900,245 A | 5/1999 | Sawhney et al. |
| 5,938,857 A | 8/1999 | Fujiwara et al. |
| 5,950,328 A * | 9/1999 | Ichiko et al. ............ 34/364 |
| 6,027,574 A | 2/2000 | Fishkin et al. |
| 6,051,248 A | 4/2000 | Sawhney et al. |
| 6,058,947 A | 5/2000 | Bennett et al. |
| 6,083,523 A | 7/2000 | Dionne et al. |
| 6,119,708 A | 9/2000 | Fishkin et al. |
| 6,148,833 A | 11/2000 | Tang et al. |
| 6,192,600 B1 | 2/2001 | Bergman |
| 6,202,658 B1 | 3/2001 | Fishkin et al. |
| 6,207,369 B1 | 3/2001 | Wohlstadter et al. |
| 6,217,894 B1 | 4/2001 | Sawhney et al. |
| 6,220,259 B1 | 4/2001 | Brown et al. |
| 6,276,371 B1 | 8/2001 | Fishkin et al. |
| 6,299,696 B2 | 10/2001 | Kamikawa et al. |
| 6,311,702 B1 | 11/2001 | Fishkin |
| 6,322,804 B1 | 11/2001 | Dionne et al. |
| 6,328,814 B1 | 12/2001 | Fishkin et al. |
| 6,345,630 B2 | 2/2002 | Fishkin et al. |
| 6,352,082 B1 | 3/2002 | Mohindra et al. |
| 6,352,710 B2 | 3/2002 | Sawhney et al. |
| 6,361,405 B1 | 3/2002 | David et al. |
| 6,379,929 B1 | 4/2002 | Burns et al. |
| 6,395,101 B1 | 5/2002 | Scranton et al. |
| 6,412,499 B1 | 7/2002 | Tang et al. |
| 6,460,551 B1 | 10/2002 | Fishkin et al. |
| 6,468,362 B1 | 10/2002 | Chen et al. |
| 6,491,043 B2 | 12/2002 | Mohindra et al. |
| 6,513,996 B1 | 2/2003 | Subramanian et al. |
| 6,516,816 B1 | 2/2003 | Husain et al. |
| 6,531,147 B2 | 3/2003 | Sawhney et al. |
| 6,620,260 B2 | 9/2003 | Kumagai et al. |
| 6,673,533 B1 | 1/2004 | Wohlstadter et al. |
| 6,722,395 B2 * | 4/2004 | Overbeck et al. .......... 141/1 |
| 6,746,544 B2 | 6/2004 | Fishkin et al. |
| 6,790,291 B2 | 9/2004 | Kimura |
| 6,849,308 B1 | 2/2005 | Speakman et al. |
| 6,875,289 B2 | 4/2005 | Christenson et al. |
| 6,913,919 B2 | 7/2005 | Botstein et al. |
| 6,930,170 B2 | 8/2005 | Desnoyers et al. |
| 6,953,836 B2 | 10/2005 | Desnoyers et al. |
| 6,955,516 B2 | 10/2005 | Achkire et al. |
| 6,956,108 B2 | 10/2005 | Desnoyers et al. |
| 6,960,351 B2 | 11/2005 | Dionne et al. |
| 6,969,690 B2 | 11/2005 | Zhou et al. |
| 6,972,185 B2 | 12/2005 | Desnoyers et al. |
| 7,252,098 B2 | 8/2007 | Fishkin et al. |
| 7,980,000 B2 * | 7/2011 | Lewis et al. ............ 34/77 |
| 8,128,589 B2 * | 3/2012 | Freeman et al. ............ 604/19 |
| 2001/0000728 A1 | 5/2001 | Sawhney et al. |
| 2001/0020482 A1 | 9/2001 | Scranton et al. |
| 2001/0021534 A1 | 9/2001 | Wohlstadter et al. |
| 2002/0036005 A1 | 3/2002 | Kimura |
| 2002/0037371 A1 | 3/2002 | Kumagai et al. |
| 2002/0072067 A1 | 6/2002 | Ashkenazi et al. |
| 2002/0072092 A1 | 6/2002 | Ashkenazi et al. |
| 2002/0072496 A1 | 6/2002 | Ashkenazi et al. |
| 2002/0072497 A1 | 6/2002 | Ashkenazi et al. |
| 2002/0103125 A1 | 8/2002 | Ashkenazi et al. |
| 2002/0121289 A1 | 9/2002 | Brown et al. |
| 2002/0123463 A1 | 9/2002 | Ashkenazi et al. |
| 2002/0127266 A1 | 9/2002 | Sawhney et al. |
| 2002/0127576 A1 | 9/2002 | Ashkenazi et al. |
| 2002/0132252 A1 | 9/2002 | Ashkenazi et al. |
| 2002/0132253 A1 | 9/2002 | Ashkenazi et al. |
| 2002/0137075 A1 | 9/2002 | Ashkenazi et al. |
| 2002/0137890 A1 | 9/2002 | Ashkenazi et al. |
| 2002/0142961 A1 | 10/2002 | Ashkenazi et al. |
| 2002/0150603 A1 | 10/2002 | Dionne et al. |
| 2002/0160384 A1 | 10/2002 | Ashkenazi et al. |
| 2002/0168671 A1 | 11/2002 | Burns et al. |
| 2002/0172969 A1 | 11/2002 | Burns et al. |
| 2002/0177164 A1 | 11/2002 | Ashkenazi et al. |
| 2002/0177551 A1 | 11/2002 | Terman |
| 2002/0193299 A1 | 12/2002 | Ashkenazi et al. |
| 2002/0193300 A1 | 12/2002 | Ashkenazi et al. |
| 2002/0197615 A1 | 12/2002 | Ashkenazi et al. |
| 2002/0197674 A1 | 12/2002 | Ashkenazi et al. |
| 2002/0198148 A1 | 12/2002 | Ashkenazi et al. |
| 2002/0198149 A1 | 12/2002 | Ashkenazi et al. |
| 2003/0003531 A1 | 1/2003 | Ashkenazi et al. |
| 2003/0008297 A1 | 1/2003 | Ashkenazi et al. |
| 2003/0017476 A1 | 1/2003 | Ashkenazi et al. |
| 2003/0017981 A1 | 1/2003 | Ashkenazi et al. |
| 2003/0017982 A1 | 1/2003 | Ashkenazi et al. |
| 2003/0022187 A1 | 1/2003 | Ashkenazi et al. |
| 2003/0027163 A1 | 2/2003 | Ashkenazi et al. |
| 2003/0027754 A1 | 2/2003 | Ashkenazi et al. |
| 2003/0027985 A1 | 2/2003 | Ashkenazi et al. |
| 2003/0032023 A1 | 2/2003 | Ashkenazi et al. |
| 2003/0035917 A1 | 2/2003 | Hyman |
| 2003/0039585 A1 | 2/2003 | Freeman |
| 2003/0040473 A1 | 2/2003 | Ashkenazi et al. |
| 2003/0044806 A1 | 3/2003 | Ashkenazi et al. |
| 2003/0045463 A1 | 3/2003 | Ashkenazi et al. |
| 2003/0049638 A1 | 3/2003 | Ashkenazi et al. |
| 2003/0049681 A1 | 3/2003 | Ashkenazi et al. |
| 2003/0049682 A1 | 3/2003 | Ashkenazi et al. |
| 2003/0050457 A1 | 3/2003 | Ashkenazi et al. |
| 2003/0054359 A1 | 3/2003 | Ashkenazi et al. |
| 2003/0054403 A1 | 3/2003 | Ashkenazi et al. |
| 2003/0054404 A1 | 3/2003 | Ashkenazi et al. |
| 2003/0054987 A1 | 3/2003 | Ashkenazi et al. |
| 2003/0059780 A1 | 3/2003 | Ashkenazi et al. |
| 2003/0059782 A1 | 3/2003 | Ashkenazi et al. |
| 2003/0059783 A1 | 3/2003 | Ashkenazi et al. |
| 2003/0059831 A1 | 3/2003 | Ashkenazi et al. |
| 2003/0059832 A1 | 3/2003 | Ashkenazi et al. |
| 2003/0059833 A1 | 3/2003 | Ashkenazi et al. |
| 2003/0060407 A1 | 3/2003 | Ashkenazi et al. |
| 2003/0064375 A1 | 4/2003 | Ashkenazi et al. |
| 2003/0068623 A1 | 4/2003 | Ashkenazi et al. |
| 2003/0068647 A1 | 4/2003 | Ashkenazi et al. |
| 2003/0069403 A1 | 4/2003 | Ashkenazi et al. |
| 2003/0073090 A1 | 4/2003 | Ashkenazi et al. |
| 2003/0073809 A1 | 4/2003 | Ashkenazi et al. |
| 2003/0077593 A1 | 4/2003 | Ashkenazi et al. |
| 2003/0077594 A1 | 4/2003 | Ashkenazi et al. |
| 2003/0082546 A1 | 5/2003 | Ashkenazi et al. |
| 2003/0083461 A1 | 5/2003 | Ashkenazi et al. |
| 2003/0087304 A1 | 5/2003 | Ashkenazi et al. |
| 2003/0087305 A1 | 5/2003 | Ashkenazi et al. |
| 2003/0089608 A1 | 5/2003 | Kumekawa |
| 2003/0089899 A1 | 5/2003 | Lieber et al. |
| 2003/0104032 A1 | 6/2003 | Sawhney et al. |
| 2003/0119055 A1 | 6/2003 | Ashkenazi et al. |
| 2003/0124531 A1 | 7/2003 | Ashkenazi et al. |
| 2003/0130182 A1 | 7/2003 | Ashkenazi et al. |
| 2003/0134284 A1 | 7/2003 | Ashkenazi et al. |
| 2003/0139329 A1 | 7/2003 | Ashkenazi et al. |
| 2003/0157113 A1 | 8/2003 | Terman |
| 2003/0194760 A1 | 10/2003 | Ashkenazi et al. |
| 2003/0219856 A1 | 11/2003 | Ashkenazi et al. |
| 2003/0224358 A1 | 12/2003 | Ashkenazi et al. |
| 2003/0228655 A1 | 12/2003 | Ashkenazi et al. |
| 2003/0228656 A1 | 12/2003 | Ashkenazi et al. |
| 2004/0086423 A1 | 5/2004 | Wohlstadter et al. |
| 2004/0136866 A1 | 7/2004 | Pontis et al. |
| 2004/0185083 A1 | 9/2004 | Dionne et al. |
| 2004/0198051 A1 | 10/2004 | Hansen et al. |
| 2004/0214783 A1 | 10/2004 | Terman |
| 2004/0234574 A9 | 11/2004 | Sawhney et al. |
| 2004/0241896 A1 | 12/2004 | Zhou et al. |
| 2005/0014226 A1 | 1/2005 | Ashkenazi et al. |
| 2005/0037491 A1 | 2/2005 | Mistry et al. |
| 2005/0112725 A1 | 5/2005 | Ashkenazi et al. |
| 2005/0143817 A1 | 6/2005 | Hunter et al. |
| 2005/0147562 A1 | 7/2005 | Hunter et al. |
| 2005/0147599 A1 | 7/2005 | Hunter et al. |
| 2005/0147643 A1 | 7/2005 | Hunter et al. |
| 2005/0148512 A1 | 7/2005 | Hunter et al. |
| 2005/0149080 A1 | 7/2005 | Hunter et al. |
| 2005/0149158 A1 | 7/2005 | Hunter et al. |
| 2005/0158274 A1 | 7/2005 | Hunter et al. |
| 2005/0165488 A1 | 7/2005 | Hunter et al. |

| | | | | | | |
|---|---|---|---|---|---|---|
| 2005/0169958 A1 | 8/2005 | Hunter et al. | DE | 4113262 | A1 | 10/1992 |
| 2005/0175657 A1 | 8/2005 | Hunter et al. | DE | 4119519 | A1 | 12/1992 |
| 2005/0175663 A1 | 8/2005 | Hunter et al. | DE | 19852735 | A1 * | 5/1999 |
| 2005/0175665 A1 | 8/2005 | Hunter et al. | EP | 321281 | A2 | 6/1989 |
| 2005/0175703 A1 | 8/2005 | Hunter et al. | EP | 324533 | A1 | 7/1989 |
| 2005/0177225 A1 | 8/2005 | Hunter et al. | EP | 614213 | A1 | 9/1994 |
| 2005/0178395 A1 | 8/2005 | Hunter et al. | EP | 860479 | A2 | 8/1998 |
| 2005/0178396 A1 | 8/2005 | Hunter et al. | EP | 1184481 | A2 | 3/2002 |
| 2005/0181008 A1 | 8/2005 | Hunter et al. | FR | 2788708 | A1 | 7/2000 |
| 2005/0181011 A1 | 8/2005 | Hunter et al. | GB | 2277747 | A * | 11/1994 |
| 2005/0181977 A1 | 8/2005 | Hunter et al. | GB | 2277747 | A | 11/1994 |
| 2005/0182463 A1 | 8/2005 | Hunter et al. | JP | 56130498 | A | 10/1981 |
| 2005/0183728 A1 | 8/2005 | Hunter et al. | JP | 57198296 | A | 12/1982 |
| 2005/0183731 A1 | 8/2005 | Hunter et al. | JP | 58061872 | A | 4/1983 |
| 2005/0186244 A1 | 8/2005 | Hunter et al. | JP | 58061872 | A * | 4/1983 |
| 2005/0186247 A1 | 8/2005 | Hunter et al. | JP | 59062370 | A | 4/1984 |
| 2005/0187140 A1 | 8/2005 | Hunter et al. | JP | 59189318 | A | 10/1984 |
| 2005/0187382 A1 | 8/2005 | Ashkenazi et al. | JP | 63185036 | A | 7/1988 |
| 2005/0191248 A1 | 9/2005 | Hunter et al. | JP | 06085034 | A | 3/1994 |
| 2005/0191331 A1 | 9/2005 | Hunter et al. | JP | 08250635 | A | 9/1996 |
| 2005/0196421 A1 | 9/2005 | Hunter et al. | JP | 08293446 | | 11/1996 |
| 2005/0208095 A1 | 9/2005 | Hunter et al. | JP | 08293576 | | 11/1996 |
| 2005/0224102 A1 | 10/2005 | Kim | JP | 2000279900 | | 10/2000 |
| 2005/0260176 A1 | 11/2005 | Ayares et al. | JP | 2002050608 | A * | 2/2002 |
| 2006/0104795 A1 | 5/2006 | Mimken | JP | 2002204992 | | 7/2002 |
| 2007/0000524 A1 | 1/2007 | Kimura | JP | 2003068697 | | 3/2003 |
| 2007/0224820 A1 | 9/2007 | Lim et al. | JP | 2008166574 | | 7/2008 |
| 2007/0295371 A1 | 12/2007 | Achkire et al. | WO | WO-9002406 | | 3/1990 |
| 2008/0155852 A1 | 7/2008 | Olgado et al. | WO | WO 9002406 | A1 * | 3/1990 |
| 2009/0084413 A1 | 4/2009 | Lewis et al. | WO | WO-9619595 | | 6/1996 |
| 2009/0139548 A1 | 6/2009 | Kim | WO | WO-03049786 | | 6/2003 |
| 2010/0155254 A1* | 6/2010 | Prabhakar et al. ............ 205/157 | WO | WO-2004070082 | | 8/2004 |
| | | | WO | WO-2005034227 | | 4/2005 |

FOREIGN PATENT DOCUMENTS

| | | | |
|---|---|---|---|
| DE | 3732510 | C1 | 4/1989 |
| DE | 4113261 | A1 | 10/1992 |

\* cited by examiner

US 8,205,352 B2

VAPOR DRYER HAVING HYDROPHILIC END EFFECTOR

CROSS-REFERENCE TO RELATED APPLICATIONS

This application is a continuation of U.S. patent application Ser. No. 12/255,247, filed Oct. 21, 2008 now U.S. Pat. No. 7,980,000, which is a continuation-in-part of U.S. patent application Ser. No. 11/967,533, filed Dec. 31, 2007, which claims benefit of U.S. Provisional Patent Application Ser. No. 60/882,894, filed Dec. 29, 2006. Each of the aforementioned patent applications is herein incorporated by reference.

BACKGROUND OF THE INVENTION

1. Field of the Invention

Embodiments of the present invention generally relate to an apparatus and methods for rinsing and drying semiconductor substrates.

2. Description of the Related Art

As semiconductor device geometries continue to decrease, the importance of ultra clean processing increases. Aqueous cleaning within a tank of fluid (or a bath) followed by a rinsing bath (e.g., within a separate tank, or by replacing the cleaning tank fluid) achieves desirable cleaning levels. After removal from the rinsing bath, absent use of a drying apparatus, the bath fluid evaporates from the substrate's surface causing streaking, spotting and/or leaving bath residue on the surface of the substrate. Such streaking, spotting and residue can cause subsequent device failure. Accordingly, much attention has been directed to improved methods for drying a substrate as it is removed from an aqueous bath.

Marangoni drying is generally used in cleaning, rinsing and drying semiconductor substrates. Marangoni drying generally creates a surface tension gradient to induce bath fluid to flow from the substrate in a manner that leaves most surface areas on the substrate virtually free of bath fluid, and thus may reduce streaking, spotting and residue marks. During Marangoni drying, a solvent miscible with the bath fluid (e.g., isopropyl alcohol (IPA) vapor) is introduced towards a fluid meniscus which is formed as the substrate is lifted from the bath or as the bath fluid is drained past the substrate. The solvent vapor is absorbed along the surface of the fluid, with the concentration of the absorbed vapor being higher at the tip of the meniscus. The higher concentration of absorbed vapor causes surface tension to be lower at the tip of the meniscus than in the bulk of the bath fluid, causing bath fluid to flow from the meniscus toward the bulk bath fluid.

During the cleaning and drying process, a substrate is generally supported by one or more end effectors. The end effectors are generally designed to contact the substrate near the edge with minimized contact point. Hydrophobic materials are employed in forming or coating the end effector to repel the bath fluid and reduce streaking and other defects. One problem with marangoni drying is that there are bath fluid droplets formed between the substrate and end effectors causing spotting defects in the substrates. Additionally, grooves or chips are easily formed on the current end effectors due to contact with substrates, thus requiring frequent replacement of the end effectors.

Therefore, there is a need for a substrate drying system having improved substrate contacting end effectors.

SUMMARY OF THE INVENTION

Embodiments of the present invention generally relate to an apparatus and methods for rinsing and drying substrates. Particularly, embodiments of the present invention provide substrate drying system having one or more end effectors which reduce formation of fluid droplets during drying.

One embodiment provides an end effector comprising a body having a contact tip for contacting an edge area of a substrate, wherein the end effector is configured to support the substrate while the substrate is in a rinsing bath and while the substrate is being dried from the rinsing bath, and the contact tip comprises a hydrophilic material.

Another embodiment provides a substrate drying system comprising a chamber body defining a drying compartment configured to receive a substrate and to retain a rinsing bath therein, a substrate support disposed in the inner volume, wherein the substrate support is configured to support the substrate while the substrate is in the rinsing bath and while the substrate is being dried from the rinsing bath, and an end effector disposed on the substrate support, wherein contact tip is configured for contacting an edge area of the substrate, and the contact tip comprises a hydrophilic material.

Yet another embodiment provides a method for drying a substrate comprising merging the substrate in a rinsing bath, supporting the substrate using an end effector having a hydrophilic contact tip in the rinsing bath, removing the substrate from the rinsing bath while supporting the substrate on the hydrophilic contact tip of the end effector, and directing a drying vapor towards the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
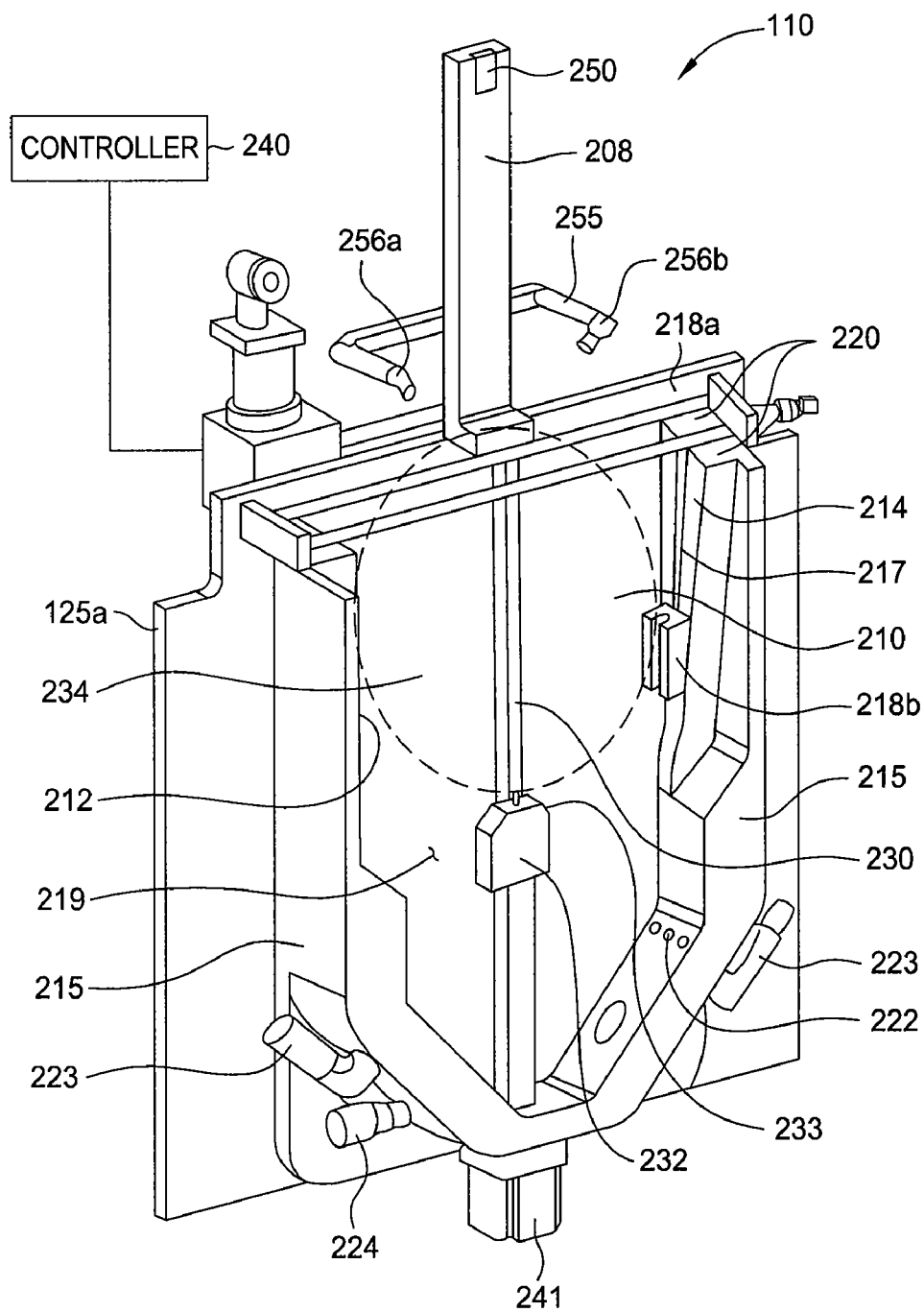
FIG. 1 is a partial perspective view of a drying module according to an embodiment of the present invention.

To facilitate understanding, identical reference numerals have been used, wherever possible, to designate identical elements that are common to the figures. It is contemplated that elements and/or process steps of one embodiment may be beneficially incorporated in other embodiments without additional recitation.

DETAILED DESCRIPTION

Embodiments of the present invention generally relate to an apparatus and methods for rinsing and drying substrates. Particularly, embodiments of the present invention provide substrate drying system having one or more end effectors which reduce formation of fluid droplets during drying. In one embodiment, an end effector comprising a hydrophilic material is used during rinsing and drying. The end effector may be formed entirely by a hydrophilic material or coated by a hydrophilic material. By using a hydrophilic material, formation of liquid droplets between the substrate and the end effector is reduced.

FIG. 1 is a partial perspective view of a drying module 110 according to an embodiment of the present invention. The drying module 110 may be used alone or in a group to enable high-throughput rinsing and drying of multiple substrates. For example, two or more drying modules can be positioned adjacent one other. The term 'adjacent' is defined herein to mean one or more of: attached to, closely adjoining, against, and/or spaced a short distance from. Accordingly, adjacent drying modules may be in contact and/or may be spaced a short distance from each other.

The module 110 may be slightly angled with respect to a vertical axis, for example, between 1 and 1.5 degrees from vertical in some embodiments, and up to 8 to 10 degrees in other embodiments. While the embodiment depicted illustrates depicts one module drying apparatus, more than one drying modules may be used. Sidewall 125a may be used to mount one or more drying modules 110.

Figure 2:
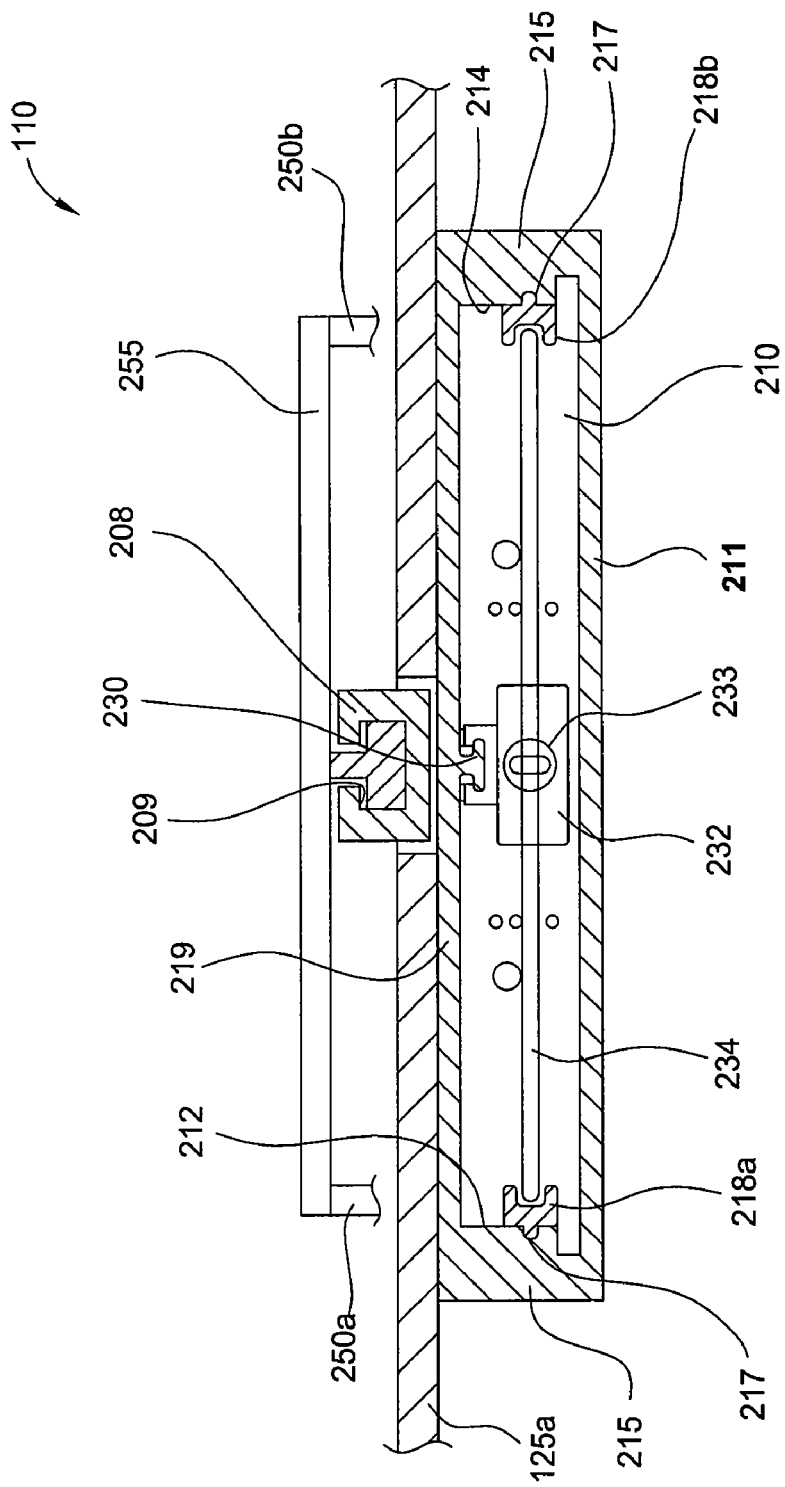
FIG. 2 is a sectional top view of the drying module of FIG. 1.

FIG. 2 is a sectional top view of the drying module 110. The drying module 110 comprises a back wall 219, a front wall 211, and sidewalls 215. The back wall 219, the front wall 211, and the sidewalls 215 define a drying compartment 210. In one embodiment, the drying compartment 210 has width and depth dimensions that define a sufficient internal volume to hold a rinsing fluid and a substrate of a desired size to be dried. FIG. 1 is a perspective view of the drying module 110 with the front wall 211 removed according to an embodiment of the present invention.

The drying compartment 210 may be filled to a suitable vertical level with a rinsing fluid. The rinsing fluid may comprise deionized water (DIW), one or more solvents, or any other chemical useful for drying a substrate and/or rinsing films and/or particulates from a substrate. One or more drain conduits and/or valves 224 may be positioned toward the bottom of the drying compartment 210 to empty used rinsing fluid, allowing the compartment to be replenished with clean rinsing fluid from an intake manifold 222 which is connected to one or more inject conduits and/or valves 223.

Each lateral surface 212, 214 of the drying compartment 210 includes an approximately vertically oriented groove 217. The groove 217 may be slightly angled from the vertical, for example, between about 1 to 1.5 degrees or at another suitable angle. Alternatively, as noted, the entire drying module 110 may be slightly angled. Each guide 218a, 218b may include any other device suitable for receiving the edge of a descending substrate and for supporting and/or positioning the substrate within the drying compartment 210. In some embodiments, the guides 218a, 218b may be V-shaped or U-shaped supporting surfaces, although other shapes may be used. The guides 218a, 218b may be stationary, or move within the respective groove 217.

The drying module 110 comprises one or more drying vapor conduits 220 positioned above the drying compartment 210. In one embodiment, the one or more drying vapor conduits 220 are coupled to the sidewall 125a. While two drying vapor conduits 220 are shown in FIG. 1, other numbers of conduits, including a single conduit, may be used. In some embodiments, each drying vapor conduit 220 may be oriented horizontally to cover the horizontal width of the drying compartment 210 and may include a number of downward oriented holes, nozzles or other fluid delivery mechanisms along a length of the conduit 220. In operation, when a drying vapor is supplied to the drying vapor conduits 220, the drying vapor is dispensed from the conduits toward a substrate positioned between the conduits 220 in the drying compartment 210. For example, a first of the conduits 220 may direct drying vapor toward a front side of a substrate while a second of the conduits 220 may direct fluid toward a backside of the substrate. As is known to those of skill in the art, the drying vapor may comprise isopropyl alcohol (IPA) and/or another chemical suitable for reducing surface tension between a substrate and rinsing fluid as the substrate is drawn out of the rinsing fluid.

A support member 208 is coupled to the sidewall 125a and configured to support a substrate during processing. In one embodiment, the support member 208 may be movably connected to the sidewall 125a.

A gripping mechanism 255 adapted to grip an edge of a substrate also may be coupled to the support member 208. The gripping mechanism 255 may comprise one or more pads, pincers or other gripping surfaces 256a, 256b for contacting and/or supporting a substrate being loaded into or unloaded from the drying compartment 210. In some embodiments, the gripping mechanism 255 and gripping surfaces 256a, 256b may be adapted to move vertically via a rail 209 or other guide, as a substrate is raised or lowered relative to the drying compartment 210.

A substrate sensor 250 may be coupled to the support member 208. The sensor 250 may comprise an infrared sensor or other suitable sensor adapted to determine whether a substrate surface is positioned in front of or in the vicinity of the sensor. In some embodiments, the substrate sensor 250 may be rotatable between a vertical, active position and a horizontal, inactive position.

The controller 240 may be employed to control operation of the drying modules, such as detecting presence of a substrate, raising/lowering a substrate, controlling delivery or removal of a substrate via a robot, delivering/supplying of drying vapor during drying, and/or the like. The controller 240 may include one or more microprocessors, microcomputers, microcontrollers, dedicated hardware or logic, or a combination of the same.

The back wall 219 of the drying module 110 comprises a vertical rail 230 along which a movable carrier device 232 is adapted to move upward and downward. In one embodiment, the movable carrier device 232 is moved by a motor 241. In one embodiment, the movement of the movable carrier device 232 is in response to signals transmitted from the controller 240.

In one embodiment, the movable carrier device 232 comprises an end effector 233 on its upper end configured to receive and/or secure a lower edge of a substrate 234. The end effector 233 is configured to support a substrate 234 while the substrate 234 in the drying compartment 210 during rinsing. The end effector 233 is also configured to support the substrate 234 while the substrate 234 is being dried from a rinsing bath, for example when the substrate 234 is being raised from the drying compartment 210 and a rinsing bath is being drained from the drying compartment 210. In one embodiment, the end effector 233 has a contact tip 235 for contacting an edge area of the substrate 234. In one embodiment, the contact tip 235 comprises a hydrophilic material. In one embodiment, the end effector 233 may be formed entirely by a hydrophilic material. In another embodiment, the end effector 233 may be coated by a hydrophilic material. Detailed description of the end effector 233 is further provided with descriptions of FIGS. 3-5.

During operation, a robot arm (not shown) may transfer a substrate in a vertical position to the gripping mechanism 255 which is positioned directly above the drying compartment 210. The gripping mechanism 255 may hold the substrate 234 securely by application of a vacuum to a set of holes on the gripping mechanism's supporting surface, or via any other suitable mechanism such as releasable edge grippers that may be selectively. In one embodiment, the gripping mechanism 255 may be precisely activated and deactivated by the controller 240 to secure or release a substrate. While the gripping mechanism 255 holds the substrate 234 over the drying compartment 210, the carrier device 232 within the drying compartment 210 moves to the top of the rail 230 via the motor 241. In this position, the top of the carrier device 232 is positioned adjacent the bottom edge of the substrate 234.

The gripping mechanism 255 is shifted from its initial position downward toward the drying compartment 210 to lower the substrate 234 with the carrier device 232 into the drying compartment 210 between the drying vapor conduits 220. The carrier device 232 may be lowered by motor 241 or passively forced downward by the action of the gripping mechanism 255. As the substrate 234 descends between the drying vapor conduits 220, the substrate 234 is received at its edge by the guides 218a.

After the substrate 234 descends a predefined distance within the drying compartment 210, as determined by the position of the carrier device 232, the gripping mechanism 255 disengages from the substrate 234. Once the substrate 234 is disengaged, the substrate 234 is supported by the end effector 233 of the carrier device 232, and the carrier device 232 moves downward bringing the substrate 234 further into the drying compartment 210 to a bottom position for processing. In this bottom position, the substrate 234 may be completely submerged in a rinsing fluid.

Once a predetermined time has elapsed and/or rinsing operations have been performed, the substrate 234 is lifted by the movable carrier device 232 from the bottom position. As the substrate 234 is lifted, the substrate 234 rests on the end effector 233 and maintains a vertical or approximately vertical (e.g., between 1 and 1.5 degrees from vertical) orientation because the substrate's motion is constrained by the guides 218a and/or 218b. The substrate 234 emerges from the rinsing fluid while supported by the end effector 233. The drying vapor conduits 220 spray drying vapor toward the substrate 234 and rinsing fluid as the substrate 234 emerges. As indicated, the drying vapor reduces surface tension between the substrate 234 and the rinsing fluid as the substrate emerges, which prevents a film of rinsing fluid from forming on and sticking to the substrate surface.

When the top of the substrate 234 has moved a certain distance out of the drying compartment 210 and has cleared the top edge of the drying compartment 210, the substrate 234 contacts the gripping mechanism 255, which grips the edge of the substrate 234. At this stage, the gripping mechanism 255 may lift the substrate 234 from the movable carrier device 232 may release and go further up. The substrate sensor 250 may be used to detect when the substrate 234 has been lifted out of the drying compartment 210.

Once the substrate sensor 250 indicates that the substrate 234 is complete out of the drying department, the robot arm may move in to remove the substrate 234 from the gripping mechanism 255 and transfer the substrate 234 for subsequence processing.

Figure 3:
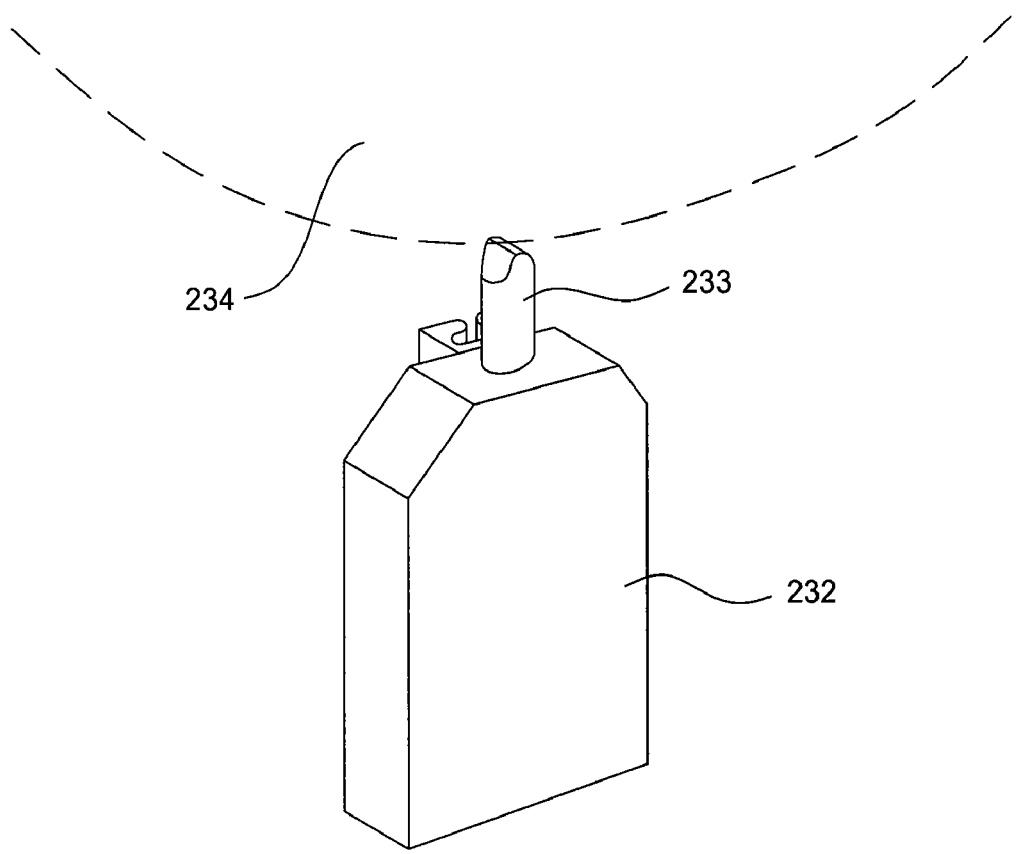
FIG. 3 is a perspective view of a movable carrier having an end effector according to one embodiment of the present invention.
Figure 4:
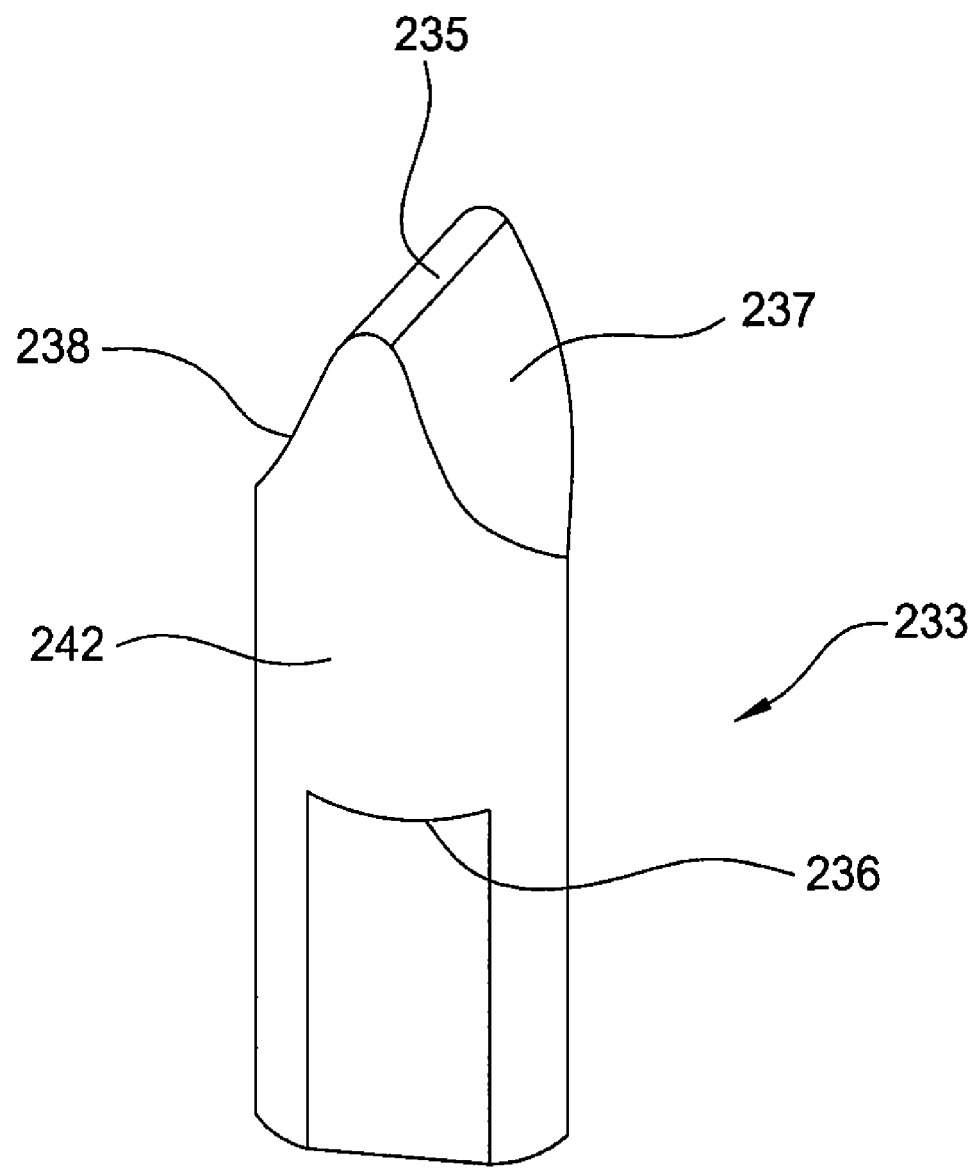
FIG. 4 is a perspective view of an end effector according to one embodiment of the present invention.

FIG. 3 is a perspective view of the movable carrier device 232 with the end effector 233 according to one embodiment of the present invention. FIG. 4 is a perspective view of the end effector 233 according to one embodiment of the present invention. The end effector 233 comprises a body 242 having a contact tip 235 formed in an upper portion. In one embodiment, the body 242 may be a cylindrical rod having a stage 236 formed in a lower portion. The stage 236 may be configured to mount the end effector 233 in the movable carrier device 232 so that the contact tip 235 is substantially perpendicular to an edge of the substrate 234. The contact tip 235 may be formed by machining two chamfers 237, 238 on opposite sides of the body 242.

In one embodiment, the end effector 233 comprises a hydrophilic material. In one embodiment, the contact tip 235 of the end effector 233 may be formed entirely by a hydrophilic material or coated by a hydrophilic material. Traditionally, hydrophobic materials, such as Polyetheretherketone (PEEK), are used in end effectors for substrate drying systems because it is believed that hydrophobic end effectors deter fluid residuals between substrates and the end effectors when the substrates are lifted from a liquid bath. However, our experiments have shown that hydrophilic end effectors reduce formation liquid droplets near edges of substrates when used to lift substrates from a liquid bath, therefore, reducing defects caused by residual droplets between the substrates and the end effectors.

Figure 5:
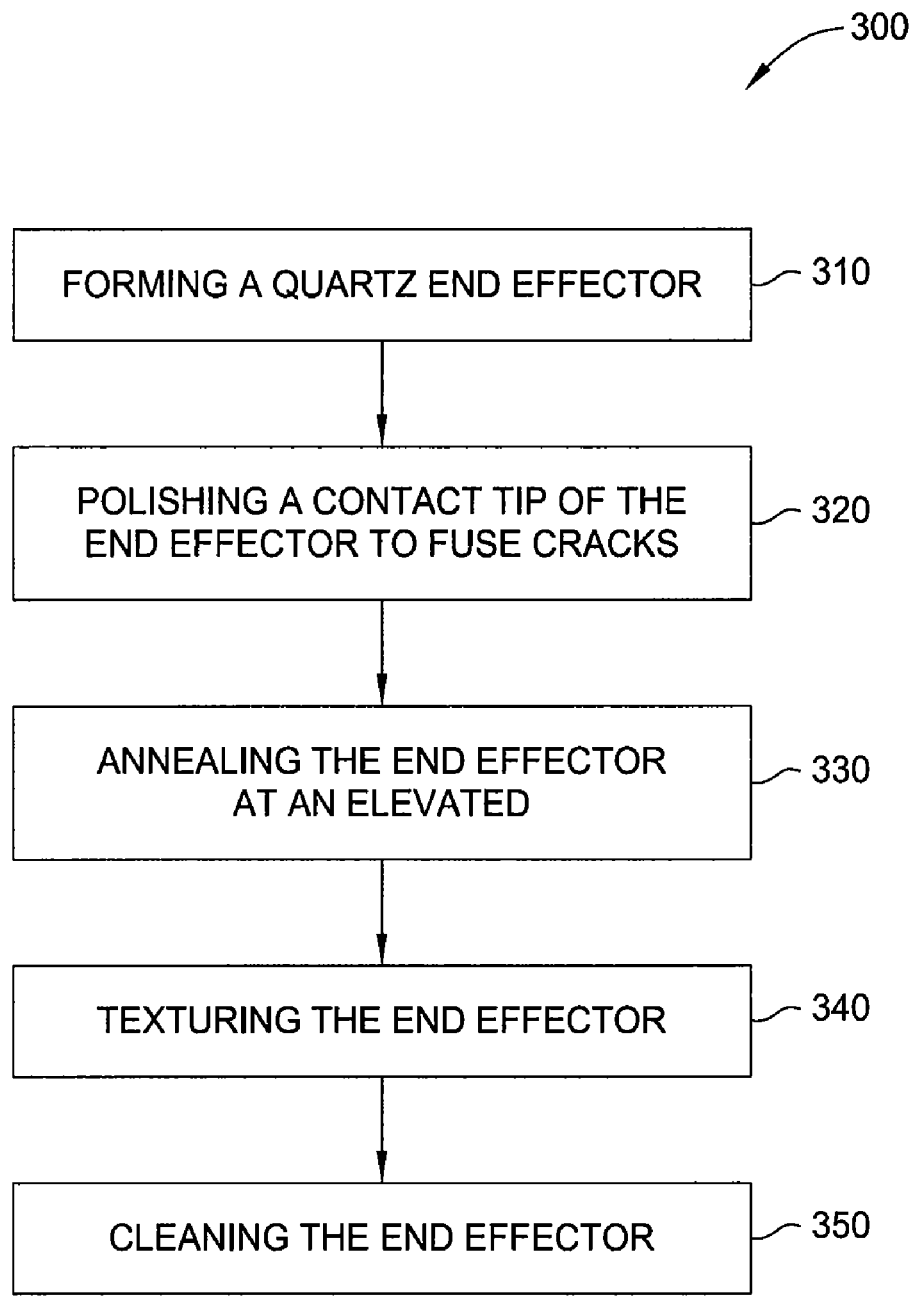
FIG. 5 is a flow chart reflecting a method for forming an end effector according to one embodiment of the present invention.

In one embodiment, the end effector 233 is formed by quartz. FIG. 5 is a flow chart reflecting a method 300 for forming the end effector 233 from quartz according to one embodiment of the present invention.

In block 310, a quartz end effector may be formed from a quartz body. Formation of the quartz end effector generally comprises forming a contact tip, such as the contact tip 235 of the end effector 233. In one embodiment forming the contact tip comprises two chamfers on opposite sides of an end effect body, such as the chamfers 237, 238 of the end effector 233. The chamfers, such as the chambers 237, 238, generally have an angle that ranges between about 45° to about 60° degrees relative to each other. One skilled in the art will appreciate that other angles may be utilized. The contact tip, such as the contact tip 235, may have a radius of between about 0.005 inch to about 0.02 inch.

In one embodiment, radius of the contact tip, such as the contact tip 235, may be set to a radius within a predetermined range to reduce stress on the contact top and thereby preventing cracks. In one embodiment, the contact tip, such as the contact tip 235, may have a radius of about 0.010 inch.

Formation of the quartz end effector may further comprise forming mounting structures, such as the stage 236 of the end effector 233.

In block 320, the quartz end effector is polished to fuse any chips or cracks in the quart end effector. In one embodiment, the contact tip is polished. In another embodiment, all sharp edges in the end effectors are polished. Polishing generally fuses any cracks or chips that may be present at the contact tip or any other edges and prevent the cracks and chips from propagating into fractures. Fused contact tip typically has increased impact resistance and not prone to chipping. In one embodiment, polishing is generally in the form of heat polishing such as laser polishing or flame polishing. In one embodiment, the polishing is performed by a flame polishing at a temperature between about 1500° C. to about 1700° C.

In block 330, the quartz end effector may be optionally annealed. In one embodiment, annealing may be performed by heating the end effector to an elevated temperature. In one embodiment, the elevated temperature may be about 1165° C. degrees.

In block 340, the quartz end effector may be textured. In one embodiment, the entire surface area of the quartz end effector may be textured to achieve a roughness of about 70 to about 93 RA. In one embodiment, texturing the quartz end effector may be performed by bead blasting. In one embodiment, aluminum oxide ($Al_2O_3$) beads are used to bead blast the quartz end effector in texturing.

In block 350, the polished end effector may be optionally cleaned to remove particles or any other contaminations. In one embodiment, cleaning the end effector may comprise degreasing, soft pad buffing, ultrasonic cleaning, brush cleaning, hydrofluoric (HF) acid dipping, or combinations thereof.

The foregoing description discloses only exemplary embodiments of the invention. Modifications of the above disclosed apparatus and methods which fall within the scope of the invention will be readily apparent to those of ordinary skill in the art. For instance, end effectors of the present invention may be used in apparatus other than dryers.

Accordingly, while the present invention has been disclosed in connection with specific embodiments thereof, it should be understood that other embodiments may fall within the spirit and scope of the invention, as defined by the following claims.

What is claimed is:

1. An end effector, comprising:
   a body having a contact tip for contacting an edge area of a substrate, wherein the end effector is configured to support the substrate while the substrate is in a rinsing bath and while the substrate is being dried from the rinsing bath, and wherein the contact tip comprises a hydrophilic material.
2. The end effector of claim 1, wherein the hydrophilic material reduces formation of liquid droplets of the rinsing bath near the edge area of the substrate when the contact tip is used to lift the substrate from the rinsing bath therefore reducing defects caused by residual droplets of the rinsing bath between the substrate and the end effector.
3. The end effector of claim 1, wherein the entire end effector is formed from the hydrophilic material.
4. The end effector of claim 3, wherein the hydrophilic material is quartz.
5. The end effector of claim 4, wherein the contact tip is polished to fuse cracks and chips.
6. The end effector of claim 5, wherein the end effector is annealed after polishing.
7. The end effector of claim 1, wherein the end effector is coated with the hydrophilic material.
8. The end effector of claim 1, wherein the body is a cylindrical rod having a stage for mounting the end effector in a movable carrier device formed in a lower portion of the body.
9. The end effector of claim 1, wherein the contact tip is formed by machining two chamfers on opposite sides of the body.
10. The end effector of claim 9, wherein the chamfers have an angle between about 45 degrees to about 60 degrees relative to each other.
11. The end effector of claim 1, wherein the contact tip has a radius of between about 0.005 inches to about 0.02 inches.
12. The end effector of claim 1, wherein an entire surface area of the end effector is texture to achieve a roughness of about 70 to about 90 RA.
13. A method of forming a quartz end effector, comprising:
    forming a contact tip for contacting an edge area of a substrate tip from a quartz body by forming two chamfers on opposite sides of the quartz body;
    forming mounting structures in a lower portion of the quartz body; and
    polishing the quartz end effector to fuse any cracks or chips that may be present at the contact tip or any other edges.
14. The method of claim 13, wherein the quartz material reduces formation of liquid droplets of a rinsing bath near the edge area of the substrate when the contact tip is used to lift the substrate from the rinsing bath therefore reducing defects caused by residual droplets of the rinsing bath between the substrate and the end effector.
15. The method of claim 13, wherein the chamfers have an angle between about 45 degrees to about 60 degrees relative to each other.
16. The method of claim 13, wherein the contact tip has a radius of between about 0.005 inches to about 0.02 inches.
17. The method of claim 13, wherein polishing the quartz end effector comprises flame polishing the quartz end effector at a temperature between about 1500 degrees Celsius and 1700 degrees Celsius.
18. The method of claim 13, further comprising:
    annealing the end effector at an elevated temperature after polishing the end effector.
19. The method of claim 13, further comprising:
    texturing an entire surface area of the quartz end effector to achieve a roughness of about 70 to about 90 RA.
20. The method of claim 19, wherein texturing an entire surface area of the quartz end effector comprises bead blasting the entire surface area of the quartz end effector.

* * * * *